United States Patent

Cohen et al.

[11] Patent Number: 6,132,657
[45] Date of Patent: Oct. 17, 2000

[54] PROCESS FOR PRODUCING POLYMERIC MATERIALS

[75] Inventors: Yachin Cohen, Haifa; Dmitry M. Rein, Nesher; Lev Vaykhansky, Haifa, all of Israel

[73] Assignee: Polyeitan Composites Ltd., Nesher, Israel

[21] Appl. No.: 09/106,488

[22] Filed: Jun. 29, 1998

[51] Int. Cl.[7] .......................... B29C 70/34; B29C 70/42
[52] U.S. Cl. .......................... 264/120; 264/126; 264/320
[58] Field of Search .................... 264/120, 126, 264/319, 248, 331.11, 331.12, 294, 320, 328.16

[56] References Cited

U.S. PATENT DOCUMENTS

| | | | |
|---|---|---|---|
| 3,607,500 | 9/1971 | Field | 264/119 |
| 4,501,856 | 2/1985 | Harpell et al. . | |
| 4,543,286 | 9/1985 | Harpell et al. . | |
| 4,563,392 | 1/1986 | Harpell et al. . | |
| 4,944,974 | 7/1990 | Zachariades . | |
| 4,996,011 | 2/1991 | Sano et al. | 264/120 |
| 5,002,714 | 3/1991 | Sano et al. | 264/119 |
| 5,030,402 | 7/1991 | Zachariades . | |
| 5,093,158 | 3/1992 | Li et al. . | |
| 5,160,472 | 11/1992 | Zachariades . | |
| 5,175,040 | 12/1992 | Harpell et al. . | |
| 5,198,281 | 3/1993 | Muzzy et al. . | |
| 5,219,502 | 6/1993 | Zaidi et al. | 264/119 |
| 5,230,854 | 7/1993 | Izod et al. . | |
| 5,244,617 | 9/1993 | Murphy et al. | 264/120 |
| 5,573,824 | 11/1996 | Klocek et al. . | |
| 5,628,946 | 5/1997 | Ward et al. | 264/257 |
| 5,824,411 | 10/1998 | Shalaby et al. . | |
| 5,834,113 | 11/1998 | Shalaby et al. . | |

FOREIGN PATENT DOCUMENTS

| | | |
|---|---|---|
| 0 116 845 | 1/1984 | European Pat. Off. . |
| 0 313 915 | 10/1988 | European Pat. Off. . |
| 0 551 837 | 1/1993 | European Pat. Off. . |
| 95/06148 | 8/1994 | WIPO . |

OTHER PUBLICATIONS

Ramani NC, "Analysis of the Effect of Pressure on Compression Moulding of UHMWPE", *J. Mat. Science: Mat. In Medicine*, 9: 165–172, 1998.

Olley et al, "Morphology of Compacted Polyethylene Fibres", *J. Materials Science*, 28: 1107–1113, 1993.

Hine et al, "The Hot Compaction of High Modulus Melt-Spun Polyethylene Fibres", *J. Materials Science*, 28: 316–324, 1993.

*Primary Examiner*—Angela Ortiz
*Attorney, Agent, or Firm*—Mark M. Friedman

[57] ABSTRACT

An improved process for producing a consolidated polymeric monolith from an assembly of thermoplastic polymer fibers. The assembly is placed under pressure to fill a majority of the voids thereof by mechanical deformation of the fibers, and heated to a temperature too low to melt the fibers at the deformation pressure but sufficiently high to at least partly melt the fibers at a lower transition pressure. While maintaining the assembly at this temperature, the pressure is reduced to the transition pressure long enough for partial melting of the fibers to fill the rest of the voids, and then is increased to a consolidation pressure at least as high as the deformation pressure. The assembly is cooled slowly to ambient temperature at the consolidation pressure.

17 Claims, 2 Drawing Sheets

PROCESS FOR PRODUCING POLYMERIC MATERIALS

FIELD AND BACKGROUND OF THE INVENTION

The present invention relates to a process for the production of polymer materials.

Rein et al., in PCT Application No. WO 97/11037, which is incorporated by reference for all purposes as if fully set forth herein, describe a process for producing a polyolefin composite material from an assembly of polyolefin fibers by treating the assembly with a solvent such as xylene, or with a solution of the polyolefin, to swell the surficial layers of the fibers, growing and crystallizing "brush layers" on the fiber surfaces, and then heating and compressing the fibers. Preferably, the fibers are first placed under tension, the swelling of the surficial layers is effected at a temperature greater than that needed to melt the unloaded fibers but less than that needed to melt the loaded fibers, and the brush layers are grown and crystallized at a lower temperature.

Harpell et al., in European Patent Application 0 116 845, describe a process for transforming a network of high molecular weight polyethylene fibers into polyethylene articles, by the simultaneous application of a temperature between 100° C. and 160° C. and high pressure. The pressure is applied long enough to attain the desired degree of fiber coalescence, from simply causing adjacent fibers to adhere, to obtaining a film-like article which is substantially free of voids.

Ward et al., in U.S. Pat. No. 5,628,946, which is incorporated by reference for all purposes as if fully set forth herein, describe a process for producing a polymer sheet. An assembly of oriented polymer fibers is compressed at a contact pressure sufficient to hold the fibers in mutual intimate contact and then heated to a temperature sufficient to induce partial melting of the fibers. The melt fills the voids between the fibers. The assembly then is maintained at that temperature while being compressed at a still higher pressure to form the final product. In some cases, for example when the polymer fibers are made of highly oriented gel spun polyethylene, there is a tradeoff in the final product between high strength in the direction of fiber alignment, obtained by only limited partial melting, and high strength transverse to the direction of fiber alignment, obtained by more extensive partial melting.

SUMMARY OF THE INVENTION

According to the present invention there is provided a process for the production of a consolidated polymeric monolith from thermoplastic polymer fibers, including the steps of: (a) forming an assembly of thermoplastic polymer fibers; (b) applying a pressure to the assembly sufficient to deform the fibers to substantially fill a majority of voids in the assembly, the assembly having a melting temperature at the deformation pressure; (c) heating the assembly to a temperature below the melting temperature but at which the assembly would at least partly melt at a transition pressure lower than the deformation pressure; and (d) subsequently reducing the applied pressure to the transition pressure while maintaining the assembly at the temperature for a time sufficient for the assembly to at least partly melt, thereby substantially filling a remainder of the voids.

It has been discovered that the process taught by Rein et al. in WO 97/11037 can be implemented with excellent results without preloading the fibers, provided that the assembly of solvent-treated or solution-treated fibers is compressed to a deformation pressure sufficiently high to fill most of the voids of the assembly by mechanically deforming the fibers. While under this deformation pressure, the assembly is heated to a temperature that is too low to melt the fibers while they are maintained at the deformation pressure but that is high enough to at least partly melt the fibers at a lower pressure, referred to herein as the transition pressure. The assembly is maintained at this temperature, and the pressure is reduced to the transition pressure long enough to induce sufficient partial melting to substantially complete the filling of the voids but not long enough to impair the mechanical strength of the final product. Finally, the pressure on the assembly is increased to a consolidation pressure at least as great as the deformation pressure, in order to stop the melting, and the assembly is cooled to the ambient temperature at the consolidation pressure. If necessary, the cycling through transition pressure and consolidation pressure is repeated one or more times, at a frequency between 0.01 Hz and 0.5 Hz. The swelling of the fibers continues, albeit at slower rate, during the application of pressure and heat to the assembly of solvent-treated or solution-treated fibers.

Furthermore, it has been found that it is not necessary to add solvent to the fiber assembly, as taught by Rein et al. The residual solvent left over on the polyolefin fibers after the manufacture of the fibers is sufficient to initiate the desired fiber consolidation. This residual solvent generally constitutes less than 2% of the fiber assembly by weight.

Unlike the process taught by Ward et al., the present invention is applicable to both oriented and unoriented fiber assemblies. The present invention allows more precise control of conditions within the assembly than the process taught by Ward et al. The heat applied to the assembly is necessarily applied from outside of the assembly. As a result, the temperature field inside the assembly is inhomogeneous, at least initially, and different portions of the assembly undergo different degrees of partial melting. According to the present invention, the assembly first is subject to pressure and heat without melting, and then the pressure is released to induce the partial melting. Because the pressure change is propagated throughout the assembly essentially instantaneously, while the temperature field in the assembly is homogeneous, the partial melting of the assembly is induced uniformly, without any limitation on the thickness of the assembly.

The scope of the present invention also includes articles of manufacture made by the process of the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of an improved process for the production of consolidated polymer monoliths.

The principles and operation of consolidated polymer monolith production according to the present invention may be better understood with reference to the accompanying description.

The assembly of polymeric fibers to be processed by the present invention may be oriented, in a variety of orientations. In particular, the fibers may be arranged as a uniaxially aligned bundle or a twisted bundle of fibers, or as an assembly of chopped fibers, or as a mat of interwoven bundles, or as a mat formed by layering bundles of fibers so that the bundles in successive layers are aligned at an angle to each other, e.g., perpendicular to each other. The bundles may be assembled and pressed into any convenient shape. The ultimate products may include, inter alia, flat sheets, rods, and bars, and also a variety of curved articles of manufacture.

The process of the present invention may utilize any polymer fibers which can be selectively melted. The susceptibility of particular polymers and particular grades of those polymers to selective melting varies, and their suitability for use in the process of this invention may be determined empirically. The present invention finds particular application in the production of polyolefin articles, especially polyethylene articles. Other classes of polymer fibers to which the present invention is applicable include unsubstituted or mono- or poly-halo-substituted vinyl polymers, unsubstituted or hydroxy-substituted polyesters, polyamides, polyetherketones, and polyacetals.

Figure 1:
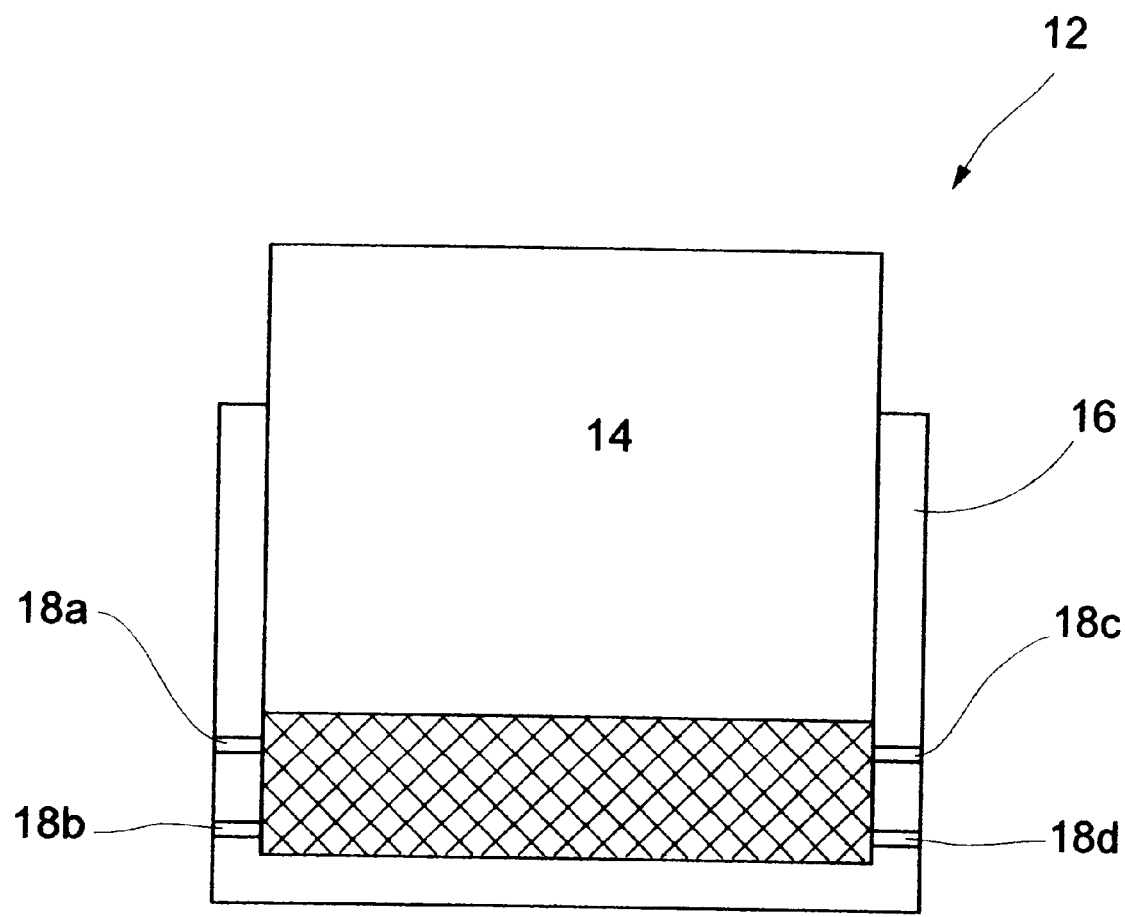
FIG. 1 illustrates the simultaneous application of uniaxial pressure and vacuum to a fiber assembly.

It is preferable to apply vacuum to the assembly to remove air from the assembly. FIG. 1 shows one method of simultaneously applying vacuum and uniaxial pressure. An oriented fiber assembly 10 is compressed in a vacuum press mold 12, between a piston 14 and a matrix 16. Compression is applied using a standard hydraulic press. During this compression, vacuum is applied to ports 18a, 18b, 18c and 18d in matrix 16. Assembly 10 is shown in FIG. 1 at its initial thickness. At the end of compression, when assembly 10 has reached its final thickness, the contact between assembly 10 and piston 14 is just below ports 18b and 18d. Suitable vacuum press molds include the KBr Die Model 129 available from Spectra-Tech Inc. of Shelton Conn.

Figure 2:
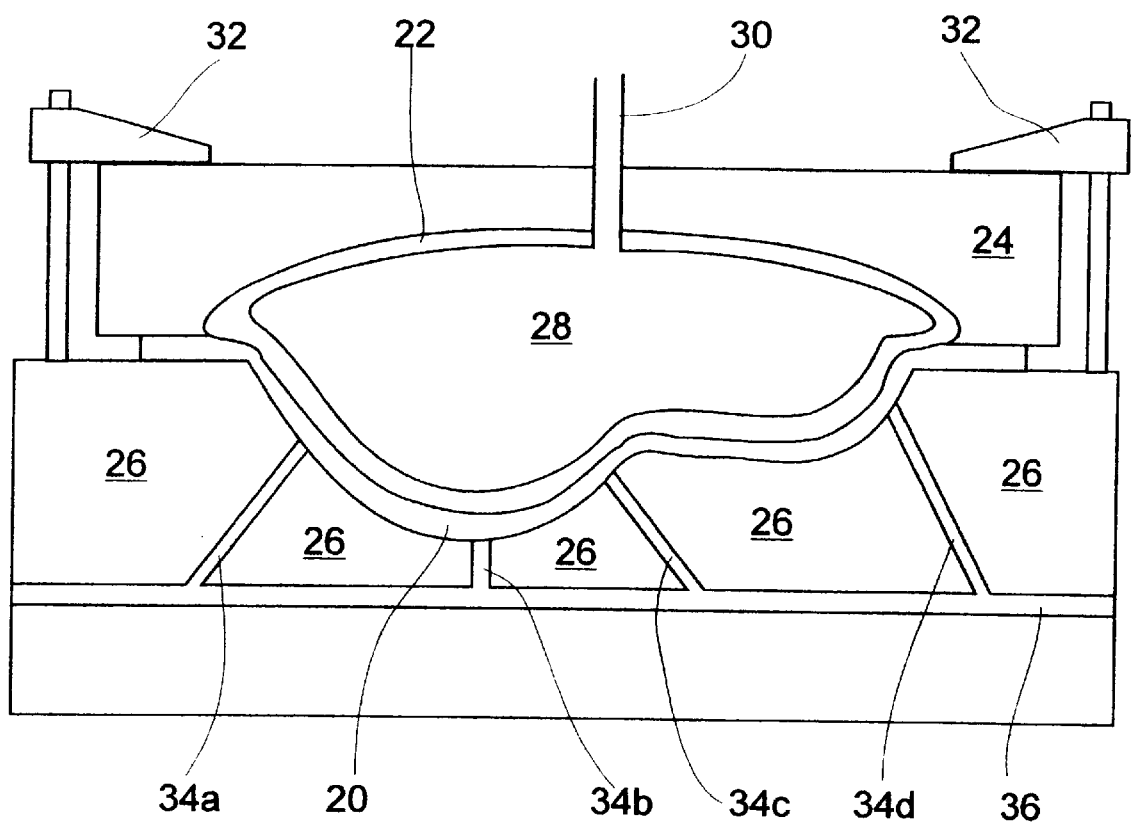
FIG. 2 illustrates the simultaneous application of triaxial pressure and vacuum to a fiber assembly.

FIG. 2 shows a method of simultaneously applying vacuum and triaxial pressure. A contoured oriented fiber assembly 20 and a flexible blister 22 are placed between an upper section 24 and a lower section 26 of a press mold. Assembly 20 is heated and compressed by the insertion of hot pressurized oil 28 into blister 22 via an inlet 30. Upper section 24 and lower section 26 are held together against the pressure of oil 28 by wedges 32. Vacuum is applied to assembly 20 via ports 34a, 34b, 34c and 34d of a vacuum manifold 36.

At the end of the heating under pressure, a large amount of internal stress typically has been induced in the assembly. If the assembly is cooled too fast, the resulting sheet suffers from crazing. Preferably, the assembly is cooled at a rate of at most 2° C./minute. Most preferably, the assembly is cooled slowly enough so that it takes 12 hours per centimeter of final assembly thickness to go from the processing temperature to ambient temperature.

EXAMPLES

The invention now will be described in more detail with reference to the following examples. In Examples 1–6, the assembly of fibers was a scoured cloth of Dyneema™ 65 UHMWPE yarn produced by DSM corporation of The Netherlands. The weight of the yarn was 440 dtex, in a 1×1 plain weave. In all cases, the rates of heating and cooling were 2° C./min.

The flexural modulus and the flexural yield strength of the sheets produced by the process were measured under the guidelines of ASTM D790. Density was measured by flotation in a water-alcohol mixture of controlled density. Ultrasound absorption was measured under the guidelines of ASTM D5300.

Example 1 (control)

(a) Apply 300 atm. of pressure. Heat to 153° C.
(b) Maintain at 300 atm. and 153° C. for 10 minutes.
(c) Maintain at 300 atm. while cooling to ambient temperature.

Example 2

(a) Apply 300 atm. of pressure. Heat to 153° C.
(b) Maintain at 300 atm. and 153° C. for 9.5 minutes.
(c) Reduce pressure to 30 atm. Maintain at 30 atm. and 153° C. for 0.15 minutes.
(d) Maintain at 300 atm. while cooling to ambient temperature.

Example 3

(a) Apply 300 atm. of pressure. Heat to 153° C.
(b) Maintain at 300 atm. and 153° C. for 9.5 minutes.
(c) Reduce pressure to 30 atm. Maintain at 30 atm. and 153° C. for 0.25 minutes.
(d) Maintain at 300 atm. while cooling to ambient temperature.

Example 4

(a) Apply 300 atm. of pressure. Heat to 153° C.
(b) Maintain at 300 atm. and 153° C. for 9.85 minutes.
(c) Reduce pressure to 30 atm. Maintain at 30 atm. and 153° C. for 0.3 minutes.
(d) Maintain at 300 atm. while cooling to ambient temperature.

Example 5

(a) Apply 300 atm. of pressure. Heat to 153° C.
(b) Maintain at 300 atm. and 153° C. for 9.85 minutes.
(c) Reduce pressure to 30 atm. Maintain at 30 atm. and 153° C. for 0.5 minutes.
(d) Maintain at 300 atm. while cooling to ambient temperature.

The flexural moduli and optical properties of the resulting sheets were as follows:

| Example | Flexural Modulus (Gpa) | Flexural strength (Mpa) | yield Density (g/cm$^3$) | Appearance |
| --- | --- | --- | --- | --- |
| 1 | 14 | 70 | 0.98 | opaque |
| 2 | 17 | 80 | 0.98 | translucent |
| 3 | 18 | 100 | 0.98 | translucent |
| 4 | 12 | 70 | 0.97 | translucent |
| 5 | 7 | 50 | 0.95 | translucent |

The opacity of Example 1 shows that the voids in the cloth had not been filled. The translucence of the other examples shows that at least all voids larger than about 0.2 microns had been filled. Note that because most of the void spaces were filled by mechanical deformation of the fibers, the optimal time for subsequent partial melting was only 0.25 minutes, considerably shorter than the 10 minute partial melting time in the Examples of Ward et al. In any case, the partial melting time according to the present invention should be no more than about one minute.

The decreased density of Examples 4 and 5 is due to an increased proportion of low-density amorphous material in those Examples.

Examples 1, 3 and 5 were subjected to further testing. The proportion of the samples that consisted of oriented polymer was estimated from x-ray diffraction patterns. The diffraction patterns were obtained using a Ni-filtered Cu Kα radiation source (Phillips PW1730) operated at 40 kV and 30 mA, and a Warhus flat-film vacuum camera using Osray C film. The sample to film distance was 5 cm and the d-spacings were calibrated using α-alumina powder. The proportion of oriented polymer in Examples 1, 3 and 5 was 100%, 100% and 95% respectively.

Examples 1 and 3 were tested further for ultrasound and light absorption. Ultrasound absorption was measured under the guidelines of ASTM standard D5300. The absorption of ultrasonic energy by Example 3 was reduced by up to 6 db relative to Example 1. The absorption of red visible light by Example 3 was reduced by up to 12 db relative to Example 1. These measurements demonstrate the increased homogeneity of Example 3 relative to Example 1.

To demonstrate the importance of slow cooling, a sixth sample was produced as in Example 3, but was allowed to cool freely instead of at a controlled rate. The resulting sheet was opaque and twisted, with visible microcrazes.

Examples 7–9 were intended to demonstrate the efficacy of the present invention in consolidating a fiber assembly with no solvent at all on the fibers. In all three of these examples, the fiber assembly was Dyneema™ SK-75 yarn wound on a steel frame. The weight of the yarn was 1760 dtex. After processing as described below, sheets dimensioned 20 cm×4 cm×0.5 cm were cut from the resulting monoliths for testing the strength of the sheets transverse to the yarn direction.

Example 7 (control): The yarn was wound on the steel frame as received from the manufacturer, with residual solvent. The wound frame was subjected to a temperature of 151° C. and a pressure of 100 atm. for 20 minutes in a mold. The resulting sheet had a transverse strength of 15 Mpa. The rate of grip motion, as measured by an Instron testing machine, was 10 mm/min.

Example 8 (control): As in Example 7, but prior to winding, the yarn was washed in a hexane bath for 5 hours to remove the residual solvent and then dried under vacuum. The washing and drying reduced the weight of the yarn by 1.5%, showing that the yarn of Example 7 included 1.5% residual solvent by weight. The resulting sheet had a transverse strength of 5.6 MPa. The rate of grip motion, as measured by an Instron testing machine, was 10 mm/min.

Example 9: The yarn was washed and dried as in Example 8 and wound on the steel frame. The wound frame was subjected to the following treatment:

(a) apply 100 atm. pressure and heat to 151° C. for about 60 minutes.
(b) reduce the pressure to 30 atm. for 4 seconds while maintaining the 151° C. temperature.
(c) while still maintaining the 151° C. temperature, increase the pressure back to 100 atm for about 5 seconds.

The pressure reduction to 30 atm. and subsequent increase to 100 atm. was repeated 4 times. The wound frame then was cooled to room temperature over the course of about 60 minutes (about 2° C. per minute) while still maintaining the 100 atm. pressure. The resulting sheet had a transverse strength of 17 Mpa. The rate of grip motion, as measured by an Instron testing machine, was 10 mm/min.

While the invention has been described with respect to a limited number of embodiments, it will be appreciated that many variations, modifications and other applications of the invention may be made.

What is claimed is:

1. A process for the production of a consolidated polymeric monolith from thermoplastic polymer fibers, comprising the steps of:
   (a) forming an assembly of thermoplastic polymer fibers;
   (b) applying a pressure to said assembly sufficient to deform the fibers to substantially fill a majority of voids in said assembly, said assembly having a melting temperature at said deformation pressure;
   (c) heating said assembly to a temperature below said melting temperature but at which said assembly would at least partly melt at a transition pressure lower than said deformation pressure; and
   (d) subsequently reducing said applied pressure to said transition pressure while maintaining said assembly at said temperature for a time sufficient for said assembly to at least partly melt, thereby substantially filling a remainder of said voids.

2. The process of claim 1, further comprising the step of:
   (e) subsequent to said reduction of said applied pressure to said transition pressure, increasing said applied pressure to a consolidation pressure at least about as great as said deformation pressure while maintaining said assembly at said temperature.

3. The process of claim 2, wherein said reducing of said pressure to said transition pressure and said subsequent increasing of said pressure to said consolidation pressure while maintaining said assembly at said temperature are effected at least twice.

4. The process of claim 2, wherein said assembly is maintained at said transition pressure for at most about one minute before said increasing of said applied pressure to said consolidation pressure.

5. The process of claim 2, further comprising the step of:
   (f) subsequent to said increasing of said applied pressure to said consolidation pressure, maintaining said assembly at said consolidation pressure while cooling said assembly.

6. The process of claim 5, wherein said cooling continues until said assembly is at ambient temperature.

7. The process of claim 6, wherein said cooling to ambient temperature is prolonged for at least 12 hours per centimeter of final thickness of said assembly.

8. The process of claim 5, wherein said cooling is effected at a rate of at most about 2° C. per minute.

9. The process of claim 1, wherein said assembly is maintained at said temperature and at said transition pressure for at most about one minute.

10. The process of claim 1, wherein said pressures are applied uniaxially.

11. The process of claim 1, wherein said pressures are applied triaxially.

12. The process of claim 1, further comprising the step of:
   (e) applying vacuum to said assembly during at least part of said application of said pressures.

13. The process of claim 1, further comprising the step of:
   (e) treating said assembly with a solvent to swell said fibers before said application of said pressure.

14. The process of claim 13, wherein said swelling of said fibers continues during said application of said pressure.

15. The process of claim 1, further comprising the step of:
(e) treating said assembly with a solution of said polymer to swell said fibers before said application of said pressure.

16. The process of claim 15, wherein said swelling of said fibers continues during said application of said pressure.

17. The process of claim 1, wherein said deformation pressure is sufficient to deform the fibers to substantially fill substantially all said voids.

* * * * *